United States Patent
Hwang

(10) Patent No.: US 9,420,730 B2
(45) Date of Patent: Aug. 16, 2016

(54) CONTAINER DATA CENTER

(71) Applicant: HON HAI PRECISION INDUSTRY CO., LTD., New Taipei (TW)

(72) Inventor: Ching-Bai Hwang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 67 days.

(21) Appl. No.: 14/569,242

(22) Filed: Dec. 12, 2014

(65) Prior Publication Data

US 2016/0157389 A1  Jun. 2, 2016

(30) Foreign Application Priority Data

Nov. 28, 2014  (CN) .......................... 2014 1 0701822

(51) Int. Cl.
*H05K 7/20* (2006.01)
*H05K 5/02* (2006.01)

(52) U.S. Cl.
CPC .......... *H05K 7/20836* (2013.01); *H05K 5/0213* (2013.01); *H05K 7/20745* (2013.01)

(58) Field of Classification Search
CPC .... H05K 7/20; H05K 7/1497; H05K 7/20745
USPC ............ 361/679.46; 454/184, 237; 312/223.2
See application file for complete search history.

(56) References Cited

U.S. PATENT DOCUMENTS

| 7,872,865 | B2 * | 1/2011 | Matsushima | ........ G11B 33/142 165/104.33 |
| 8,248,793 | B2 * | 8/2012 | Bash | .................. H05K 7/20609 312/236 |
| 2012/0162909 | A1 * | 6/2012 | Peng | .................... H05K 7/1497 361/679.58 |
| 2013/0137357 | A1 * | 5/2013 | Chang | ................ H05K 7/20836 454/184 |

* cited by examiner

*Primary Examiner* — Dion R Ferguson
*Assistant Examiner* — Mandeep S Buttar
(74) *Attorney, Agent, or Firm* — ScienBiziP, P.C.

(57) ABSTRACT

A container data center includes a container, a number of air filtering modules, a number of cabinets received in the container, a heat dissipation apparatus, and a controller apparatus. The container includes a first sidewall defining a number of air inlets and a second sidewall defining a number of air outlets. A number of shielding plates are rotatably connected to the second sidewall to cover the air outlets. The air filtering modules are mounted to the first sidewall aligning with the air inlets. Each air filtering module defines a through hole communicating with the corresponding air inlet. Each air filtering module includes a number of fans and a number of rotating plates rotatably connected to cover the through hole. The controller apparatus includes a first motor driving the shielding plates, a second motor driving the rotating plates, a temperature sensor, a switch controlling the heat dissipation apparatus.

15 Claims, 6 Drawing Sheets

CONTAINER DATA CENTER

FIELD

The subject matter herein generally relates to data centers, and more particularly to a container data center.

BACKGROUND

With increasing use of on-line applications, the need for computer data centers has increased rapidly. Data centers are centralized computing facilities that include many servers, often arranged on server racks or shelves, and one rack or shelf with some servers can be considered a server system. During operation, server systems generate heat in the data centers, and the heat can be dissipated by using air conditioners.

BRIEF DESCRIPTION OF THE DRAWINGS

Implementations of the present technology will now be described, by way of example only, with reference to the attached figures.

DETAILED DESCRIPTION

Figure 1:
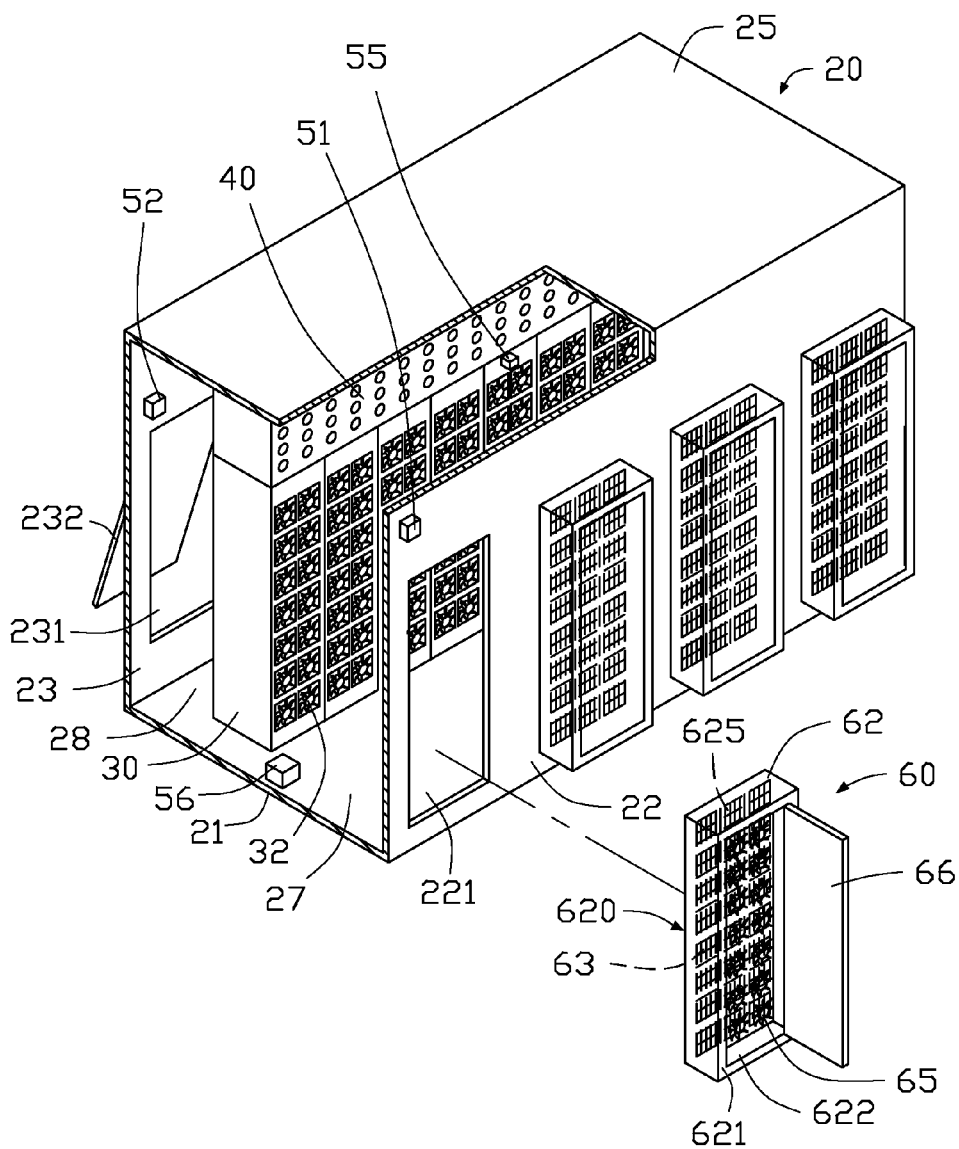
FIG. 1 is a partially cutaway, exploded, isometric view of a first embodiment of a container data center.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The present disclosure is described in relation to a container data center.

Figure 2:
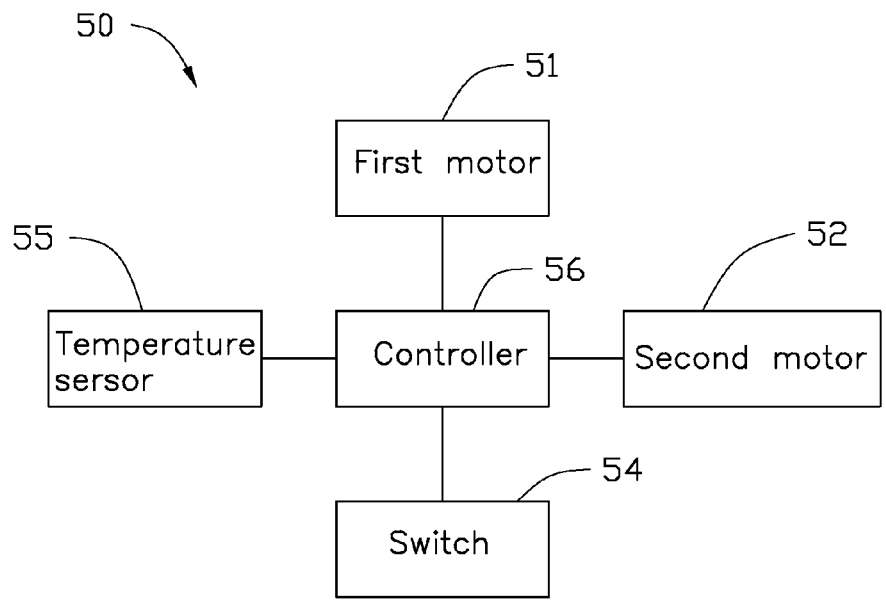
FIG. 2 is a block diagram of a controller apparatus of the container data center of FIG. 1.

FIG. 1 illustrates a container data center 100. The container data center 100 comprises a container 20, a line of server cabinets 30 received in the container 20, a heat dissipation apparatus 40 mounted on tops of the server cabinets 20, a plurality of air filtering modules 60, and a controller apparatus 50 (shown in FIG. 2). In the embodiment, the heat dissipation apparatus 40 is a refrigerator.

The container 20 comprises a substantially rectangular bottom wall 21, a first sidewall 22 substantially perpendicularly extending up from a first side of the bottom wall 21, a second sidewall 23 substantially perpendicularly extending up from a second side of the bottom wall 21 opposite to the first sidewall 22, and a top wall 25. The first sidewall 22 defines a plurality of air inlets 221 arrayed along a lengthwise direction of the first sidewall 22. The second sidewall 23 defines a plurality of air outlets 231 arrayed along a lengthwise direction of the second sidewall 23. A plurality of shielding plates 232 can be rotatably coupled to a side of the corresponding air outlets 231. The server cabinets 30 are located between the first sidewall 22 and the second sidewall 23, and arrayed along the lengthwise direction of the first sidewall 22. Each server cabinet 30 comprises a plurality of first fans 32 facing the first sidewall 22. The first sidewall 22 and the line of server cabinets 30 cooperatively bound a cooling channel 27. The second sidewall 23 and the line of server cabinets 30 cooperatively bound a heat channel 28. The air inlets 221 communicate with the cooling channel 27, and the air outlets 231 communicate with the heat channel 23.

Each air filtering module 60 comprises a bracket 62 detachably mounted to an outer surface of the first sidewall 22. The bracket 62 comprises a first wall 620 attached to the first sidewall 22, and a second wall 621 opposite to the first wall 620. A ventilation hole 625 is defined in the first wall 620 and aligned with the corresponding air inlet 221 of the container 20. An air filtering member 63 is attached to the ventilation hole 625 and received in the bracket 62. A plurality of second fans 65 are attached to the filtering member 63. An opening 622 is defined in the second wall 621 communicating with the ventilation hole 625, and a rotating plate 66 is rotatably coupled to a side of each opening 622.

The controller apparatus 50 comprises a first motor 51 driving the rotating plate 66 to rotate, a second motor 52 driving the shielding plates 232 to rotate, a temperature sensor 55, a switch 54 controlling the heat dissipation apparatus 40 to turn on or turn off, and a controller 56. The controller 56 is electronically coupled to the first motor 51, the second motor 52, the switch 54, and the temperature sensor 55. The temperature sensor 55 is mounted to an upper portion of one of the cabinets 30, and received in the cooling channel 27.

Figure 3:
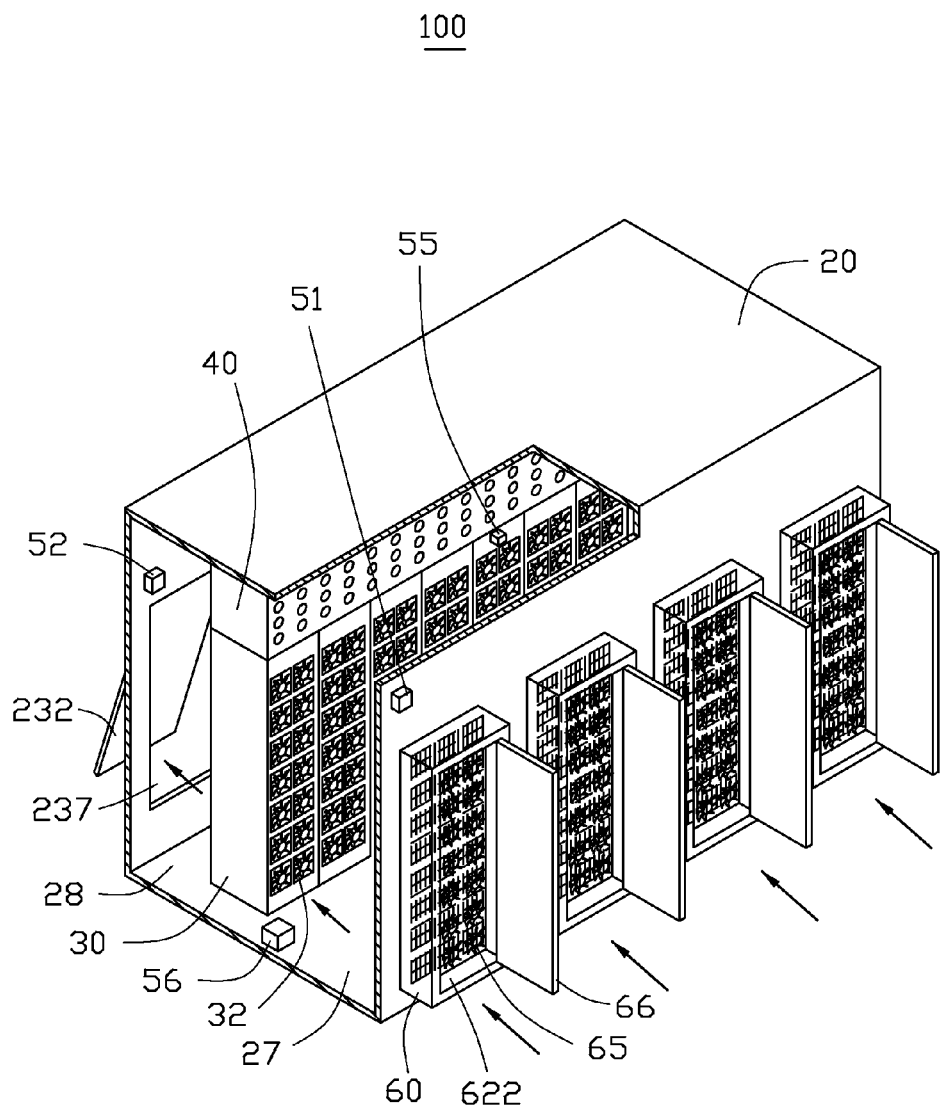
FIG. 3 is an assembled, isometric view of FIG. 1 showing the container data center in a state of use.
Figure 4:
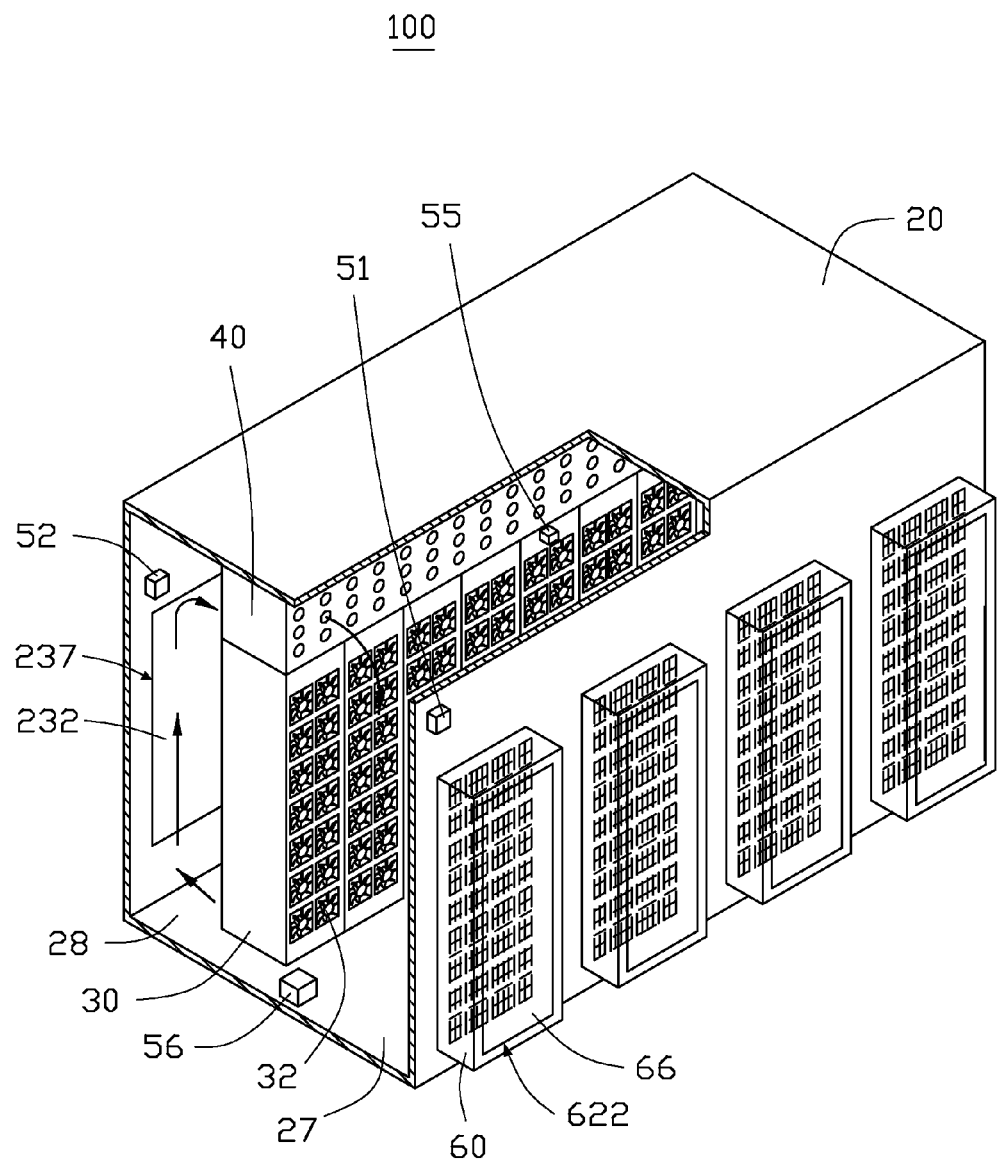
FIG. 4 is similar to FIG. 3, but shows a different state of use.

FIGS. 3 and 4 show that the container data center 100 in use. The server cabinets 30 generates heat when in use, the controller 56 controls the first motor 55 to rotate the rotating plates 66 toward or away from the openings 622, and the controller 56 controls the second motor 52 to rotate the shielding plates 232 toward or away from the air outlets 231, to control air volumes passing through the openings 622 and the air outlets 231. The second fans 65 of the air filtering modules 60 operate and draw airflow from the opening 622 to enter in the cooling channel 27 of the container 20 through the ventilation holes 625 and the air inlets 221. The first fans 32 operate and draw the airflow from the cooling channel 27 to flow through the server cabinets 30, and the heat generated by the server cabinets 30 is absorbed by the airflow. Thus, the airflow absorbs the heat generated by the sever cabinets 30. The heated airflow flows through the heat channel 28 and dissipates out of the container 20 through the air outlets 231. The temperature sensor 55 measures a temperature of the airflow in the cooling channel 27 to obtain a sensed temperature to be sent to the controller 56. The controller 56 compares the sensed temperature with a predetermined value saved in the controller 50.

If the sensed temperature is greater than the predetermined value, the controller 56 controls the first motor 51 to rotate the rotating plates 66 toward the opening 622, the controller 56 controls the second motor 52 to rotate the shielding plates 232 toward the air outlets 231, to allow less air volumes passing through the openings 622 and the air outlets 231. The controller 56 turns on the heat dissipation apparatus 40 to generate cool air. Thereby, the cool air enters the cooling channel 27, the first fans 32 drive the cool air to flow through the server cabinets 30 to absorb heat generated by the server cabinets 30, and the heated air enters into the heat channel 28. The heated air enters into the heat dissipation apparatus 40.

If the sensed temperature is less than the predetermined value, the controller 56 controls the first motor 51 to rotate the rotating plates 66 away from the openings 622, the controller 56 controls the second motor 52 to rotate away from the air outlets 231, to allow more air volumes passing through the openings 622 and the air outlets 231. The controller 56 turns off the heat dissipation apparatus 40. The second fans 65 drive airflow to flow through the ventilation holes 625 and the corresponding air inlets 221 entering into the cooling channel 27. The first fans 32 drive the airflow to flow through the server cabinets 30 to absorb heat generated by the server cabinet 30, and the heated air enters into the heat channel 28. The heated air flows out the container 20 through the air outlets 231.

Figure 5:
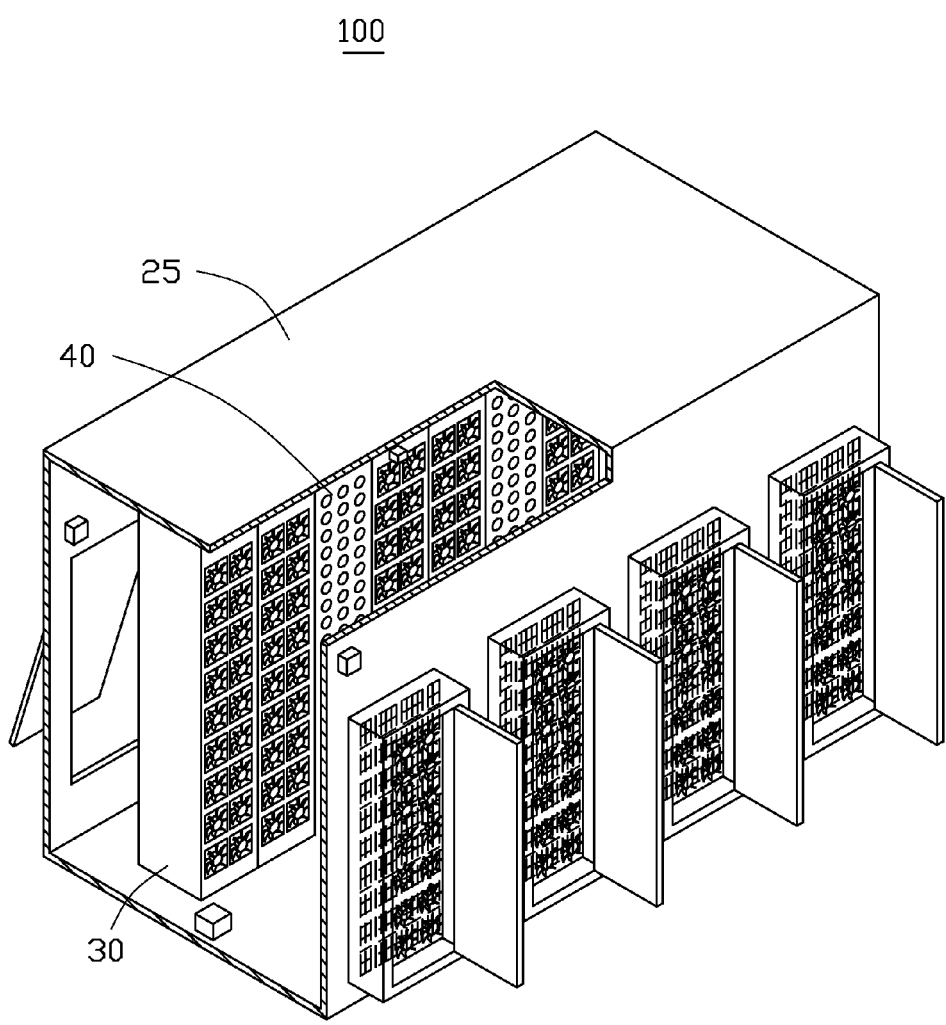
FIG. 5 is a partially cutaway, isometric view of a second embodiment of a container data center.

FIG. 5 illustrates a second embodiment of a container data center 100. The second embodiment of the container data center 100 is substantially similar to the first embodiment of the container data center 100. In the second embodiment, a top surface of each server cabinet 30 contacts an inner surface of the top wall 25 of the container 20, a plurality of heat dissipation apparatus 40 is vertically located between the server cabinets 30.

Figure 6:
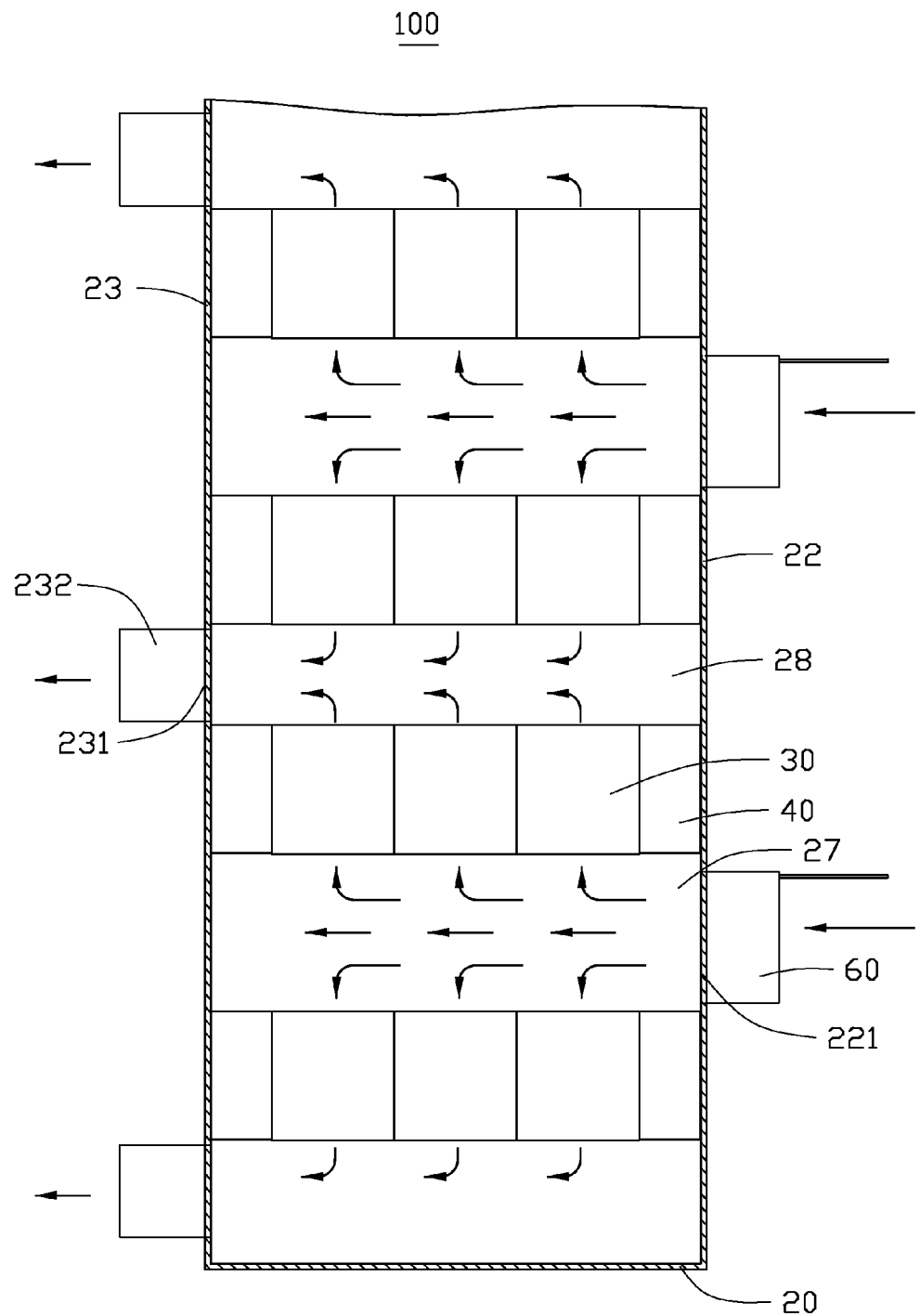
FIG. 6 is a diagrammatic view of a third embodiment of a container data center showing the container data center in a state of use.

FIG. 6 illustrates a third embodiment of a container data center 100. The third embodiment of the container data center 100 is substantially similar to the first embodiment of the container data center 100. In the third embodiment, a plurality of rows of server cabinets 30 along a direction perpendicular to the second sidewall 23 are received in the container 20, and two heat dissipation apparatuses 40 are located at two opposite ends of each row of the server cabinets 30. A side of each row of the server cabinet 30 forms a cooling channel 27, the other side of each row of the server cabinets 30 forms a heat channel 28. The first sidewall 22 defines a plurality of air inlets 221 aligning with the cooling channels 27, and the second sidewall 23 defines a plurality of air outlets 231 aligning with the heat channels 28. The air filtering modules 60 are detachably installed to the first sidewall 22 facing the air inlets 221. The shielding plates 232 can be rotatably coupled to the second sidewall 23 for covering the air outlets 231.

Even though numerous characteristics and advantages of the embodiments have been set forth in the foregoing description, together with details of the structure and function of the embodiments, the present disclosure is illustrative only, and changes may be made in the details, including in the matters of shape, size, and arrangement of parts within the principles of the embodiments to the full extent indicated by the broad general meaning of the terms in which the appended claims are expressed.

What is claimed is:

1. A container data center comprising:
   a container comprising a first sidewall defining a plurality of air inlets, a second sidewall defining a plurality of air outlets, and a plurality of shielding plates rotatably coupled to sides of the air outlets;
   a plurality of air filtering modules coupled to the first sidewall to align with the air inlets, wherein each air filtering module comprises a first wall, and a second wall opposite to the first wall, the first wall defines a ventilation hole communicating with the corresponding air inlet, an opening is defined in the second wall and communicated with the ventilation hole, and a rotating plate rotatably coupled to a side of the opening;
   a plurality of server cabinets received in the container;
   a heat dissipation apparatus received in the container; and
   a controller apparatus comprising a first motor, a second motor, a temperature sensor attached to the sever cabinets, a switch controlling the heat dissipation apparatus, and a controller, wherein the first motor, the second motor, the temperature sensor, and the switch are electrically coupled to the controller, the controller controls the first motor and the second motor to rotate the rotating plate and the shielding plate to control air volumes passing through the openings and the air outlets based on sensed temperatures sensed by the temperature sensor, and the controller turns off or turns on the heat dissipation apparatus.

2. The container data center of claim 1, wherein when the sensed temperature is greater than a predetermined value, the controller controls the first motor to rotate the rotating plates toward the openings, the controller controls the second motor to rotate the shielding plates toward the air outlets, and the controller turns on the heat dissipation apparatus to generate cool air.

3. The container data center of claim 1, wherein when the sensed temperature is less than the predetermined value, the controller controls the first motor to rotate the rotating plates away from the openings, the controller controls the second motor to rotate the shielding plates away from the air outlets, and the controller turns off the heat dissipation apparatus.

4. The container data center of claim 1, wherein a plurality of fans is attached the first wall and aligned with the corresponding ventilation holes.

5. The container data center of claim 4, wherein each air filtering module further comprises an air filtering member mounted between the first wall and the fans.

6. The container data center of claim 1, wherein the server cabinets are located between the first sidewall and the second sidewall, and arranged along a lengthwise direction of the first sidewall.

7. The container data center of claim 6, wherein the first sidewall and the server cabinets cooperatively bound a cooling channel, the second sidewall and the server cabinets cooperatively bound a heat channel, the air outlets communicate with the heat channel, the air inlets communicate with the cooling channel, and the temperature sensor is attached to the server cabinets and received in the cooling channel.

8. The container data center of claim 6, wherein the container further comprises a top wall, the heat dissipation apparatus is sandwiched between the top wall and tops of the server cabinets.

9. The container data center of claim 6, wherein the container further comprises a top wall, a top of each server cabinet contacts an inner surface of the top wall, the heat dissipation apparatus is sandwiched between the server cabinets.

10. A container data center comprising:
- a container comprising a first sidewall, a second sidewall parallel to the first sidewall, and a plurality of shielding plates, wherein the first sidewall defines a plurality of air inlets, and the second sidewall defines a plurality of air outlets, the shielding plates are rotatably coupled to sides of the air outlets;
- a plurality of air filtering modules coupled to the first sidewall to align with the air inlets, wherein each air filtering module comprises opposite first wall and second wall, the first wall defines a ventilation hole communicating with the corresponding air inlet, an opening is defined in the second wall and communicated with the ventilation hole, a rotating plate is rotatably coupled to a side of the opening;
- a plurality rows of server cabinets received in the container along a direction perpendicular to the second sidewall, wherein one side of each row of the server cabinets forms a cooling channel and the other side of the row of the server cabinets forms a heat channel, each air inlet communicates with the corresponding cooling channel, each air outlet communicates with the corresponding heat channel;
- a pair of heat dissipation apparatus located at two opposite ends of each row of the server cabinets; and
- a controller apparatus comprising a first motor, a second motor, a temperature sensor received in one of the cooling channel, a switch, and a controller, wherein the first motor, the second motor, the temperature sensor, and the switch are electrically coupled to the controller, the controller controls the first motor and the second motor to rotate the rotating plate and the shielding plate toward or away from the openings and the air outlets based on sensed temperatures sensed by the temperature sensor, and the controller turns on or turns the heat dissipation apparatus.

11. The container data center of claim 10, wherein when the sensed temperature is greater than a predetermined value, the controller controls the first motor to rotate the rotating plates toward the openings, the controller controls the second motor to rotate the shielding plates toward the air outlets, and the controller turns on the heat dissipation apparatus to generate cool air.

12. The container data center of claim 10, wherein when the sensed temperature is less than the predetermined value, the controller controls the first motor to rotate the rotating plates away from the openings, the controller controls the second motor to rotate the shielding plates away from the air outlets, and the controller turns off the heat dissipation apparatus.

13. The container data center of claim 10, wherein a plurality of fans is attached the first wall and aligned with the corresponding ventilation holes.

14. The container data center of claim 13, wherein each air filtering module further comprises an air filtering member mounted between the first wall and the fans.

15. The container data center of claim 10, wherein each row of the server cabinets are located between the first sidewall and the second sidewall.

* * * * *